United States Patent
Labonte et al.

(10) Patent No.: US 7,968,418 B1
(45) Date of Patent: Jun. 28, 2011

(54) APPARATUS AND METHOD FOR ISOLATING INTEGRATED CIRCUIT COMPONENTS USING DEEP TRENCH ISOLATION AND SHALLOW TRENCH ISOLATION

(75) Inventors: Andre P. Labonte, Lewiston, ME (US); Todd P. Thibeault, Gorham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 452 days.

(21) Appl. No.: 11/786,002

(22) Filed: Apr. 10, 2007

(51) Int. Cl.
*H01L 21/331* (2006.01)
(52) U.S. Cl. ........ 438/359; 438/322; 438/424; 438/427; 438/435
(58) Field of Classification Search .................. 438/427, 438/353, 355, 359, 360, 361, 404, 411, 421, 438/424, 425, 435, 437
See application file for complete search history.

(56) References Cited

U.S. PATENT DOCUMENTS

| | | | |
|---|---|---|---|
| 5,943,578 A * | 8/1999 | Katakabe et al. | 438/359 |
| 6,110,797 A | 8/2000 | Perry et al. | |
| 6,214,696 B1 * | 4/2001 | Wu | 438/424 |
| 6,680,238 B2 | 1/2004 | Song | |
| 6,734,524 B1 | 5/2004 | Parthasarathy et al. | |
| 6,885,080 B2 | 4/2005 | Chen et al. | |
| 6,930,027 B2 | 8/2005 | Parthasarathy et al. | |
| 6,936,910 B2 | 8/2005 | Ellis-Monaghan et al. | |
| 7,396,732 B2 * | 7/2008 | Kunnen | 438/322 |
| 2005/0176215 A1 * | 8/2005 | Jeong et al. | 438/427 |
| 2005/0245042 A1 * | 11/2005 | Haupt et al. | 438/424 |
| 2006/0252257 A1 * | 11/2006 | Ahn et al. | 438/637 |

* cited by examiner

*Primary Examiner* — Kevin M Picardat

(57) ABSTRACT

An isolation trench structure includes both a deep trench isolation (DTI) trench and a shallow trench isolation (STI) trench. The DTI trench can be formed by etching a deeper, narrower trench in a substrate and filling the deeper trench with one or more materials (such as an oxide). The STI trench can be formed by etching a shallower, wider trench in the substrate and filling the shallower trench with one or more materials (such as an oxide). The STI trench surrounds a portion of the DTI trench, such as by completely encircling an upper portion of the DTI trench. The DTI and STI trenches are filled during different operations, and the DTI and STI trenches can be filled with the same material(s) or with different material(s).

20 Claims, 3 Drawing Sheets

US 7,968,418 B1

APPARATUS AND METHOD FOR ISOLATING INTEGRATED CIRCUIT COMPONENTS USING DEEP TRENCH ISOLATION AND SHALLOW TRENCH ISOLATION

TECHNICAL FIELD

This disclosure is generally directed to integrated circuits and more specifically to an apparatus and method for isolating integrated circuit components using deep trench isolation and shallow trench isolation.

BACKGROUND

Integrated circuits routinely include components that are formed closely together. For example, bipolar transistors and other types of transistors are often fabricated next to each other on a substrate. The formation of transistors close to one another can often lead to problems, such as when the structure of one transistor overlaps or collides with the structure of another transistor.

To avoid problems such as this, trenches are often formed between transistors or other components in an integrated circuit. For example, a trench can be formed in a substrate between two transistors before the transistors are formed. The trench helps to separate the areas of the substrate where the two transistors are being formed.

There are several different types of trenches used in integrated circuits. Deep trench isolation (DTI) typically refers to a process for forming deeper, narrower trenches in a substrate. Shallow trench isolation (STI) typically refers to a process for forming shallower, wider trenches in a substrate. It is also possible to combine the two processes, such as by forming a shorter, wider trench over a deeper, narrower trench in a substrate. In this technique, both the deeper trench and the narrower trench are simultaneously filled with one or more materials, such as an oxide.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 4, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
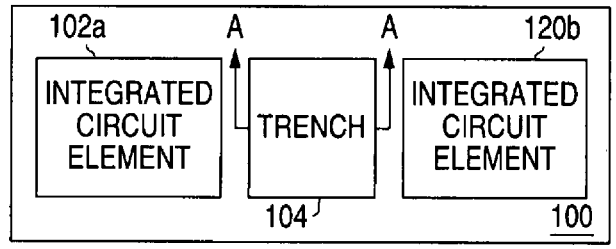
FIG. 1 illustrates an example integrated circuit according to one embodiment of this disclosure.

FIG. 1 illustrates an example integrated circuit 100 according to one embodiment of this disclosure. The embodiment of the integrated circuit 100 shown in FIG. 1 is for illustration only. Other embodiments of the integrated circuit 100 may be used without departing from the scope of this disclosure.

As shown in FIG. 1, the integrated circuit 100 includes various integrated circuit elements 102a-102b. The integrated circuit elements 102a-102b represent any suitable components forming circuitry operable to perform any suitable function. For example, the integrated circuit elements 102a-102b could include transistors, such as bipolar transistors or BiCMOS transistors (bipolar transistors implemented using Complementary Metal Oxide Semiconductor or "CMOS" technology). The integrated circuit elements 102a-102b could also include logic gates, latches, flip-flops, and other circuit elements. The integrated circuit elements 102a-102b represent any suitable integrated circuit structures arranged to perform one or more functions.

The integrated circuit 100 also includes one or more isolation trench structures 104. The isolation trench structures 104 separate two or more of the integrated circuit elements 102a-102b. For example, an isolation trench structure 104 could be formed in a substrate, and the isolation trench structure 104 could separate doped areas of the substrate that are associated with different transistors. In this way, the integrated circuit elements 102a-102b can be formed closely together without having the structures of the integrated circuit elements 102a-102b collide or overlap. This may help to reduce the area needed to produce the integrated circuit 100 or to avoid defects in the integrated circuit 100.

Figure 2:
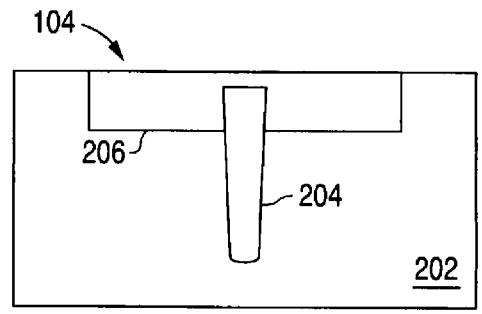
FIG. 2 illustrates an example isolation trench structure having a deep trench isolation (DTI) trench and a shallow trench isolation (STI) trench according to one embodiment of this disclosure.

FIG. 2 illustrates an example isolation trench structure 104 having a deep trench isolation (DTI) trench and a shallow trench isolation (STI) trench according to one embodiment of this disclosure. The isolation trench structure 104 shown in FIG. 2 represents a cross sectional view of the trench structure 104 taken along line A-A in FIG. 1. This embodiment of the isolation trench structure 104 is for illustration only. Other embodiments of the isolation trench structure 104 could be used without departing from the scope of this disclosure.

As shown in FIG. 2, the isolation trench structure 104 is formed in a substrate 202. The substrate 202 represents any suitable structure for supporting the various elements of the integrated circuit 100. The substrate 202 could, for example, represent a silicon substrate or other substrate.

In this example, the isolation trench structure 104 includes a deep trench structure 204 and a shallow trench structure 206. The deep trench structure 204 represents a deeper and narrower trench formed in the substrate 202 and filled with material. The shallow trench structure 206 represents a shallower and wider trench formed in the substrate 202 and filled with material. Each of these trenches could be filled with any suitable material(s), such as an oxide (like silicon dioxide or its variants). The material(s) in the trench structures 204-206 could be the same or different. In particular embodiments, the deep trench structure 204 is filled with a furnace TEOS (tetraethoxysilan or tetraethylorthosilicate), and the shallow trench structure 206 is filled with a high density plasma oxide.

As described in more detail below, the deep trench structure 204 and the shallow trench structure 206 are formed and filled separately. For example, as shown below, the deep trench structure 204 can be formed and filled with an oxide. The shallow trench structure 206 can then be formed around an upper portion of the deep trench structure 204 and filled with an oxide.

The separate formation and filling of the trench structures 204-206 could have several benefits. For example, certain films or other types of material can be used to fill the deep trench structure 204 that could not be used to fill the shallow trench structure 206, such as a material with a high wet etch rate. Also, certain manufacturing processes might be unable to use a single operation to fill both of the trench structures 204-206. In addition, this technique may avoid problems associated with conventional dual-trench techniques, such as by reducing topography and cross-wafer uniformity problems.

Although FIG. 1 illustrates one example of an integrated circuit 100 and FIG. 2 illustrates one example of an isolation trench structure 104 in an integrated circuit 100, various changes may be made to FIGS. 1 and 2. For example, the relative dimensions (such as shapes, thicknesses, and sizes) of the various layers or structures shown in FIGS. 1 and 2 are for illustration only and are not necessarily drawn to scale. As a particular example, the dimensions of various structures and layers in FIG. 2 may be exaggerated for clarity and ease of description.

FIGS. 3A through 3J illustrate an example manufacturing process for manufacturing an isolation trench structure 104 having a DTI trench and an STI trench according to one embodiment of this disclosure. The manufacturing process shown in FIGS. 3A through 3J is for illustration only. Other manufacturing processes could be used to manufacture the isolation trench structure 104 without departing from the scope of this disclosure.

Figure 3A:
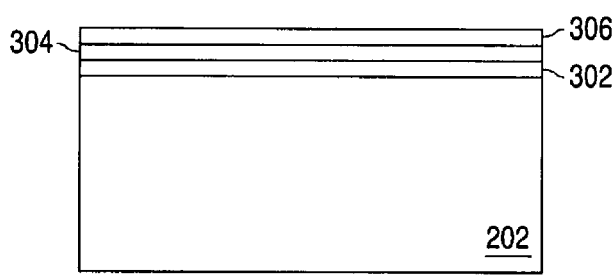
FIGS. 3A through 3J illustrate an example manufacturing process for manufacturing an isolation trench structure having a DTI trench and an STI trench according to one embodiment of this disclosure.

In FIG. 3A, three layers 302-306 are formed on the substrate 202. The layers 302-306 represent a stack of materials used to facilitate the formation of the isolation trench structure 104. In some embodiments, the layer 302 represents a barrier layer, the layer 304 represents a stop layer, and the layer 306 represents a hard mask layer. In these embodiments, the layer 302 could act as a barrier to protect the substrate 202 (such as from materials in other layers). Also, the layer 304 could act as a stop layer for subsequent manufacturing steps, such as one or more subsequent chemical mechanical polishing operations. In addition, the layer 306 could act as a mask layer used during formation of the deep trench structure 204. Each of the layers 302-306 could include any material or materials that are suitable for the intended function of the layer. For example, the layers 302 and 306 could be formed from an oxide (such as silicon dioxide or its variants), and the layer 304 could be formed from a nitride (such as silicon nitride or its variants).

Figure 3B:
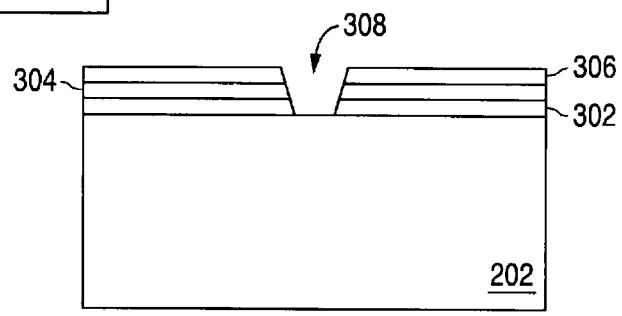

In FIG. 3B, an opening 308 is formed in the layers 302-306. The opening 308 represents a gap in the layers 302-306 that exposes the underlying substrate 202. The opening 308 in the layers 302-306 could be formed in any suitable manner, such as by etching through the layers 302-306. Also, the opening 308 could have any suitable size and shape, and the sides of the opening 308 may or may not be angled (although angled sides are shown in the figures).

Figure 3C:
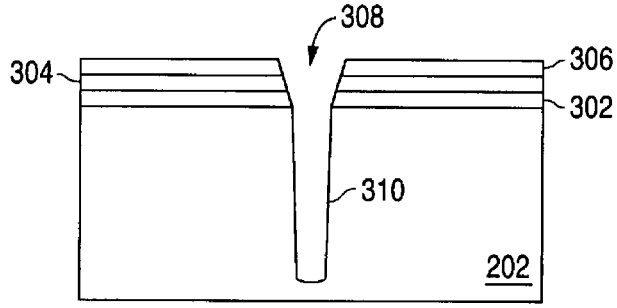

In FIG. 3C, a deep trench 310 is formed in the substrate 202. The deep trench 310 could be formed in any suitable manner, such as by etching the substrate 202 through the opening 308 in the layers 302-306. In this example, the layer 306 may act as a hard mask layer, helping to prevent etching of the substrate 202 in other areas or to prevent etching of the lower layers 302-304 in other areas (although some etching of the layers 302-304 around the opening 308 may occur). While not shown in FIG. 3C, a protective layer could be formed in the deep trench 310 after formation of the deep trench 310. The protective layer could help to protect the substrate 202 during subsequent manufacturing steps. The protective layer could represent any suitable material(s), such as an oxide liner.

Figure 3D:
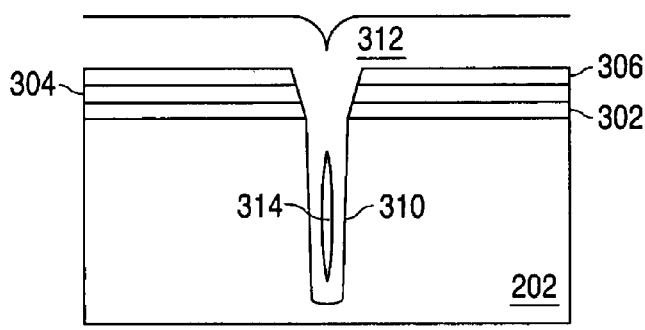

In FIG. 3D, an oxide material 312 is deposited over the layer 306 and in the deep trench 310. The oxide material 312 could be formed in any suitable manner, such as by using chemical vapor deposition. The oxide material 312 could also represent any suitable material or materials. In particular embodiments, depending on how the oxide material 312 is deposited, a seam 314 may be created in the oxide material 312 deposited within the deep trench 310. The seam 314 represents a portion of the deep trench 310 where the oxide material 312 is not deposited. Rather, a void in the oxide material 312 may exist within the deep trench 310. However, the existence of the seam 314 may not adversely affect the isolation trench structure 104.

Figure 3E:
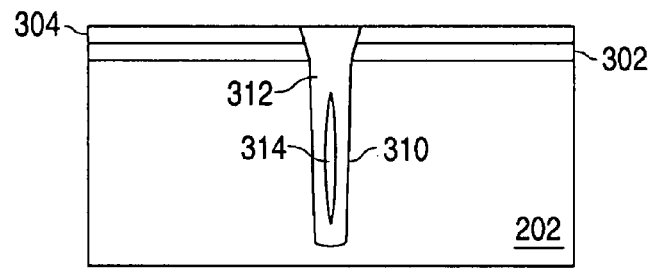

In FIG. 3E, the oxide material 312 is planarized. Any suitable technique could be used to planarize the oxide material 312. Also, the layer 306 may be removed during this step. For example, a chemical mechanical polish could be used to remove the oxide material 312 and the layer 306 down to the layer 304, which could represent a nitride layer or other stop layer for the polish. At this point, the oxide material 312 remains within the deep trench 310. While not shown in FIG. 3E, it may be necessary to strip and redeposit the layer 304 depending on, for example, the selectivity or uniformity of the chemical mechanical polish.

Figure 3F:
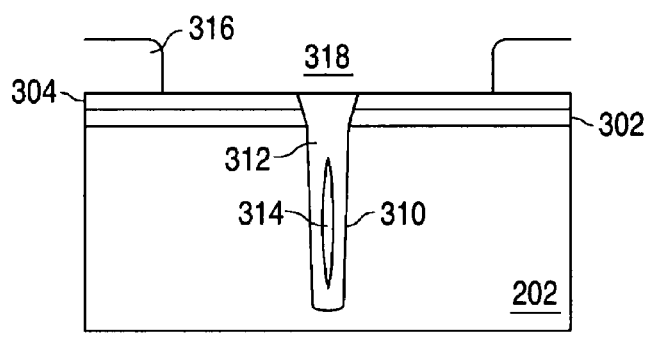

In FIG. 3F, a resist layer 316 is deposited on the layer 304 and patterned to form an opening 318. The resist layer 316 could represent any suitable photoresist material and can be formed in any suitable manner. As shown here, the opening 318 in the resist layer 316 is formed to the size and shape of the shallow trench structure 206 to be formed.

Figure 3G:
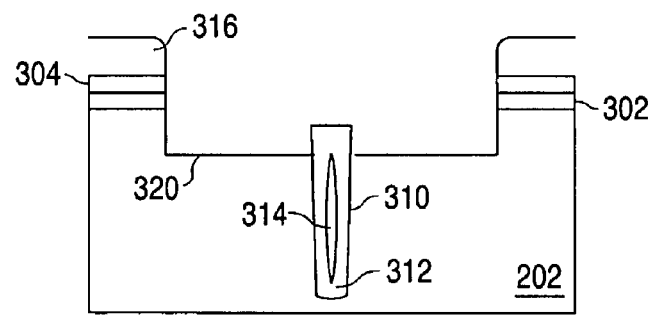

In FIG. 3G, a shallow trench 320 is formed in the substrate 202. The shallow trench 320 can be formed in any suitable manner, such as by etching. In particular embodiments, two etch processes are used. In the first etch process, a non-selective etch is used to etch through the exposed portions of the two layers 302-304 in the opening 318. Because this is a non-selective etch, it may also etch through part of the oxide material 312 in the upper portion of the deep trench 310. In the second etch process, a selective etch (such as a selective Si:Ox etch) is used to etch through the substrate 202 while leaving the oxide material 312 that was deposited in the deep trench 310 substantially intact. Although not shown in FIG. 3G, a protective layer may be formed in the shallow trench 320 after formation of the shallow trench 320. The protective layer could help to protect the substrate 202 during subsequent manufacturing steps. The protective layer could represent any suitable material(s), such as an oxide liner. Also, the resist layer 316 can be removed or stripped off the layer 304.

Figure 3H:
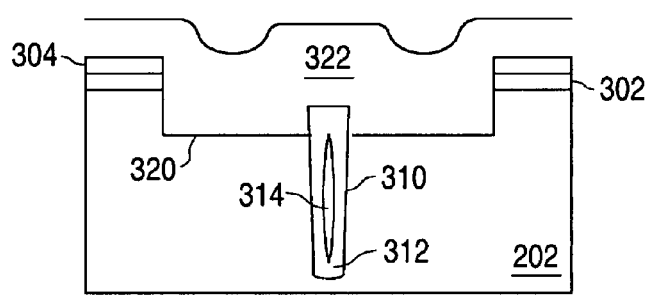

In FIG. 3H, an oxide material 322 is deposited in the shallow trench 320 and over the layer 304. The oxide material 322 also surrounds the upper portion of the oxide material 312 that was originally deposited in the deep trench 310. The oxide material 322 could be formed in any suitable manner, such as by using chemical vapor deposition. The oxide material 322 could also represent any suitable material or materials.

Figure 3I:
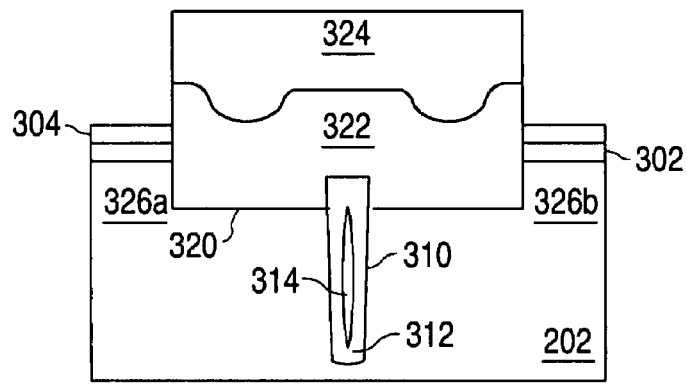

In FIG. 3I, a resist layer 324 is formed over the oxide material 322 and formed into an appropriate pattern. The resist layer 324 allows a portion of the oxide material 322 to be removed, such as by using a dry or wet etch. For example, portions 326a-326b of the substrate 202 could represent active areas of an integrated circuit, such as areas of the substrate 202 forming part of bipolar or BiCMOS transistors. The resist layer 324 could therefore be used to remove the oxide material 322 formed over the active areas 326a-326b. As another example, the resist layer 324 could be used to help smooth the topography of the oxide material 322, such as extreme topographies that might interfere with a subsequent chemical mechanical polish or other operation. However, this operation is optional and may not need to be performed. Also, the resist layer 324 can be removed or stripped off the layer 304.

Figure 3J:
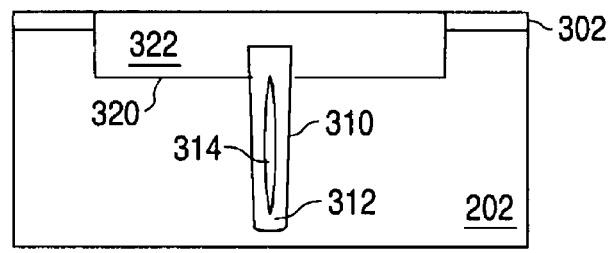

In FIG. 3J, the oxide material 322 is planarized. Any suitable technique could be used to planarize the oxide material 322. For example, a chemical mechanical polish could be used to remove the oxide material 322 down to the layer 304, which could represent a nitride layer or other stop layer for the polish. The layer 304 (such as a nitride layer) can also be stripped or removed from the structure. At this point, the oxide material 322 remains in the shallow trench 320. This forms the completed isolation trench structure 104.

In this example, the layer 302 forms part of the isolation trench structure 104 as shown in FIG. 3J. In particular embodiments, the layer 302 could form part of a CMOS well implant screen oxide or other structure that is formed over the isolation trench structure 104. In other embodiments, the layer 302 could be removed. For example, a separate step or tool could be used to remove the layer 302 (and part of the oxide material 322 in the shallow trench 320) after the layer 304 is removed.

Although FIGS. 3A through 3J illustrate one example of a manufacturing process for manufacturing an isolation trench structure 104 in an integrated circuit 100, various changes may be made to FIGS. 3A through 3J. For example, the isolation trench structure 104 could be manufactured in any other suitable manner, several examples of which have been described above.

Figure 4:
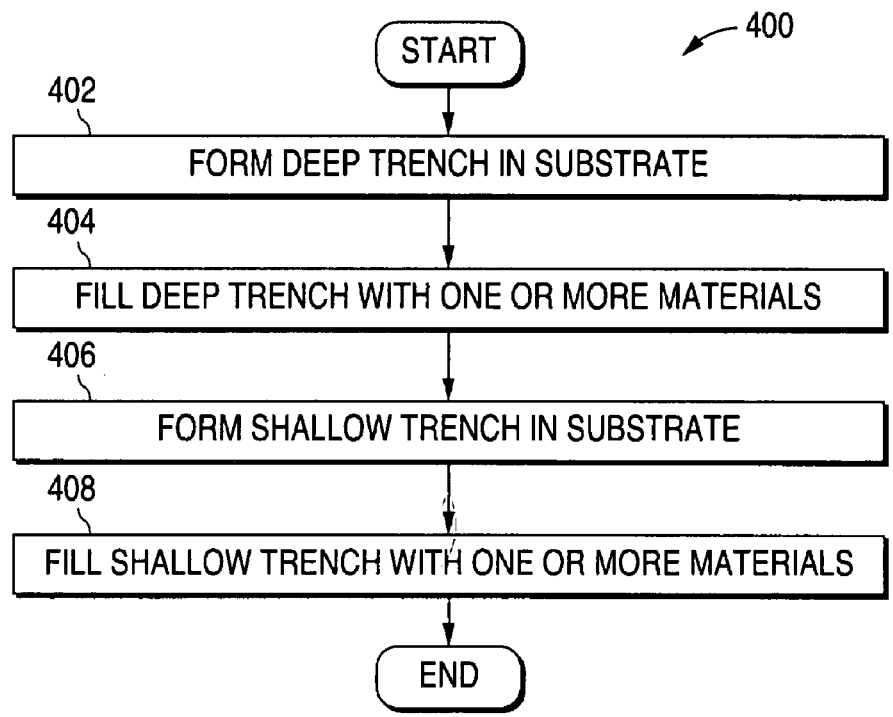
FIG. 4 illustrates an example method for forming an isolation trench structure having a DTI trench and an STI trench in an integrated circuit according to one embodiment of this disclosure.

FIG. 4 illustrates an example method 400 for forming an isolation trench structure having a DTI trench and an STI trench in an integrated circuit according to one embodiment of this disclosure. The embodiment of the method 400 shown in FIG. 4 is for illustration only. Other embodiments of the method 400 could be used without departing from the scope of this disclosure.

A deep trench is formed in a substrate at step 402. This could include, for example, etching an opening 308 in layers 302-306 that are disposed on a substrate 202. This could also include etching the deep trench 310 in the substrate 202 through the opening 308.

The deep trench is filled with an oxide or other material(s) at step 404. This could include, for example, depositing oxide material 312 in the deep trench 310 and over the substrate 202. This could also include planarizing the oxide material 312, such as by polishing the structure down to the stop layer 304. At this point, the oxide material 312 remains in the deep trench 310 (with or without a seam 314 in the oxide material 312).

A shallow trench is formed in the substrate at step 406. This could include, for example, depositing a resist layer 316 and patterning the resist layer 316 to form an opening 318. This could also include etching through the portions of the layers 302-304 exposed through the opening 318 in the resist layer 316. This etch may remove the upper portion of the oxide material 312 that was deposited in the deep trench 310. This could further include etching through the substrate 202 to form the shallow trench 320, which may be formed around at least part of the remaining oxide material 312 that was deposited in the deep trench 310.

The shallow trench is filled with an oxide or other material(s) at step 408. This could include, for example, depositing oxide material 322 in the shallow trench 320 and over the substrate 202. This could also include planarizing the oxide material 322, such as by polishing the structure down to the stop layer 304. This could further include stripping or removing the stop layer 304. At this point, the oxide material 322 remains in the shallow trench 320, and the isolation trench structure 104 has been formed with both a DTI trench and an STI trench.

Although FIG. 4 illustrates one example of a method 400 for forming an isolation trench structure 104 having a DTI trench and an STI trench in an integrated circuit 100, various changes may be made to FIG. 4. For example, various structures in the isolation trench structure 104 could be formed in any other suitable manner or in a different order.

It may be advantageous to set forth definitions of certain words and phrases that have been used within this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. In addition, terms implying a directional relationship (such as "upper" and "lower") are used only with respect to the drawings and are not meant to limit the scope of this disclosure.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A method of forming an isolation trench structure comprising:
    forming a first trench in a substrate and in a stack of layers over the substrate, wherein the first trench comprises a top portion that is wider within the stack and a bottom portion that is narrower within the substrate, and wherein the top portion of the first trench has more angled sides within the stack and the bottom portion of the first trench has less angled sides within the substrate;
    depositing one or more first materials in the first trench;
    forming a second trench in the substrate and the stack, wherein forming the second trench comprises performing a two-step etch process, wherein a first etch step non-selectively removes exposed portions of the stack down to the substrate and removes the one or more deposited first materials in the top portion of the first trench, wherein a second etch step selectively removes exposed portions of the substrate while leaving the remaining one or more first materials in the bottom portion of the first trench substantially intact, wherein the second trench completely encircles an upper section of the bottom portion of the first trench, and wherein the second trench is more shallow than the first trench; and
    depositing one or more second materials in the second trench, wherein the one or more second materials completely encircle the upper section of the bottom portion of the first trench.

2. The method of claim 1, wherein the first trench is narrower and deeper than the second trench.

3. The method of claim 1, wherein:
the upper section of the bottom portion of the first trench rises above a bottom of the second trench; and
the one or more second materials completely encircle the upper section of the bottom portion of the first trench in a plane parallel to a surface of the substrate in which the first and second trenches are formed.

4. The method of claim 1, wherein forming the first trench comprises:
forming an opening in the stack, wherein the stack comprises at least one oxide layer and at least one nitride layer formed over the substrate; and
etching the first trench in the substrate through the opening.

5. The method of claim 4, wherein depositing the one or more first materials in the first trench comprises:
depositing the one or more first materials within the first trench and over the at least one oxide layer and the at least one nitride layer; and
planarizing the one or more deposited first materials to the at least one nitride layer.

6. The method of claim 1, wherein forming the second trench comprises:
forming an opening in a resist layer formed over the substrate; and
etching the second trench in the substrate and the stack through the opening.

7. The method of claim 6, wherein etching the second trench through the opening comprises:
performing the first etch step through the opening to etch the stack, wherein the stack comprises at least one oxide layer and at least one nitride layer formed over the substrate; and
performing the second etch step through the opening and through the stack to etch the second trench in the substrate.

8. The method of claim 7, wherein depositing the one or more second materials in the second trench comprises:
depositing the one or more second materials within the second trench and over the at least one oxide layer and the at least one nitride layer; and
planarizing the one or more deposited second materials to the at least one nitride layer.

9. The method of claim 1, wherein:
the one or more first materials in the first trench comprise a furnace tetraethoxysilane or tetraethylorthosilicate; and
the one or more second materials in the second trench comprise a high density plasma oxide.

10. An isolation trench structure formed by:
forming a first trench in a substrate and in a stack of layers over the substrate, wherein the first trench comprises a top portion that is wider within the stack and a bottom portion that is narrower within the substrate, and wherein the top portion of the first trench has more angled sides within the stack and the bottom portion of the first trench has less angled sides within the substrate;
depositing one or more first materials in the first trench;
forming a second trench in the substrate and the stack using a two-step etch process, wherein a first etch step non-selectively removes exposed portions of the stack down to the substrate and removes the one or more deposited first materials in the top portion of the first trench, wherein a second etch step selectively removes exposed portions of the substrate while leaving the remaining one or more first materials in the bottom portion of the first trench substantially intact, wherein the second trench completely encircles an upper section of the bottom portion of the first trench, and wherein the second trench is more shallow than the first trench; and
depositing one or more second materials in the second trench, wherein the one or more second materials completely encircle the upper section of the bottom portion of the first trench.

11. The isolation trench structure of claim 10, wherein the first trench is narrower and deeper than the second trench.

12. The isolation trench structure of claim 10, wherein:
the upper section of the bottom portion of the first trench rises above a bottom of the second trench; and
the one or more second materials completely encircle the upper section of the bottom portion of the first trench in a plane parallel to a surface of the substrate in which the first and second trenches are formed.

13. The isolation trench structure of claim 10, wherein the first trench is formed by:
forming an opening in the stack, wherein the stack comprises at least one oxide layer and at least one nitride layer formed over the substrate; and
etching the first trench in the substrate through the opening.

14. The isolation trench structure of claim 13, wherein the one or more first materials are deposited in the first trench by:
depositing the one or more first materials within the first trench and over the at least one oxide layer and the at least one nitride layer; and
planarizing the one or more deposited first materials to the at least one nitride layer.

15. The isolation trench structure of claim 10, wherein the second trench is formed by:
forming an opening in a resist layer formed over the substrate; and
etching the second trench in the substrate and the stack through the opening.

16. The isolation trench structure of claim 15, wherein the second trench in the substrate is etched through the opening by:
performing the first etch step through the opening to etch the stack, wherein the stack comprises at least one oxide layer and at least one nitride layer formed over the substrate; and
performing the second etch step through the opening and through the stack to etch the second trench in the substrate.

17. The isolation trench structure of claim 16, wherein the one or more second materials are deposited in the second trench by:
depositing the one or more second materials within the second trench and over the at least one oxide layer and the at least one nitride layer; and
planarizing the one or more deposited second materials to the at least one nitride layer.

18. The isolation trench structure of claim 10, wherein:
the one or more first materials in the first trench comprise a furnace tetraethoxysilane or tetraethylorthosilicate; and
the one or more second materials in the second trench comprise a high density plasma oxide.

19. An integrated circuit comprising:
at least two integrated circuit elements; and
an isolation trench structure separating the at least two integrated circuit elements, the isolation trench structure formed by:
forming a first trench in a substrate and in a stack of layers over the substrate, wherein the first trench comprises a top portion that is wider within the stack and a bottom portion that is narrower within the substrate, and wherein the top portion of the first trench has more angled sides within the stack and the bottom portion of the first trench has less angled sides within the substrate;

depositing one or more first materials within the first trench;

forming a second trench in the substrate and the stack using a two-step etch process, wherein a first etch step non-selectively removes exposed portions of the stack down to the substrate and removes the one or more deposited first materials in the top portion of the first trench, wherein a second etch step selectively removes exposed portions of the substrate while leaving the remaining one or more first materials in the bottom portion of the first trench substantially intact, wherein the second trench completely encircles an upper section of the bottom portion of the first trench, and wherein the second trench is more shallow than the first trench; and depositing one or more second materials within the second trench, wherein the one or more second materials completely encircle the upper section of the bottom portion of the first trench.

20. The integrated circuit of claim 19, wherein the at least two integrated circuit elements comprise bipolar or BiCMOS transistors.

* * * * *